United States Patent
Kobayakawa et al.

(10) Patent No.: US 9,748,448 B2
(45) Date of Patent: Aug. 29, 2017

(54) LED MODULE

(75) Inventors: Masahiko Kobayakawa, Kyoto (JP); Naoyuki Kizu, Kyoto (JP)

(73) Assignee: ROHM CO., LTD., Kyoto (JP)

(*) Notice: Subject to any disclaimer, the term of this patent is extended or adjusted under 35 U.S.C. 154(b) by 0 days.

(21) Appl. No.: 13/695,075

(22) PCT Filed: Apr. 28, 2011

(86) PCT No.: PCT/JP2011/060435
§ 371 (c)(1),
(2), (4) Date: Oct. 29, 2012

(87) PCT Pub. No.: WO2011/136357
PCT Pub. Date: Nov. 3, 2011

(65) Prior Publication Data
US 2013/0043501 A1 Feb. 21, 2013

(30) Foreign Application Priority Data

Apr. 30, 2010 (JP) ................. 2010-104767

(51) Int. Cl.
*H01L 33/48* (2010.01)
*H01L 33/54* (2010.01)
*H01L 33/62* (2010.01)

(52) U.S. Cl.
CPC ............ *H01L 33/486* (2013.01); *H01L 33/54* (2013.01); *H01L 33/62* (2013.01);
(Continued)

(58) Field of Classification Search
CPC ..... H01L 33/33; H01L 33/483; H01L 33/486; H01L 33/52; H01L 33/54
(Continued)

(56) References Cited

U.S. PATENT DOCUMENTS 6,624,491 B2 9/2003 Waitl et al.
7,227,190 B2 6/2007 Yasukawa et al.
(Continued)

FOREIGN PATENT DOCUMENTS

JP 2002-520823 7/2002
JP 2004-127988 4/2004
(Continued)

OTHER PUBLICATIONS

Machine translation, Iwasaki, JP 2007-35794, translation date: Sep. 26, 2013, JPO & Japio, all pages.*
(Continued)

*Primary Examiner* — Victoria K Hall
(74) *Attorney, Agent, or Firm* — Hamre, Schumann, Mueller & Larson, P.C.

(57) ABSTRACT

An LED module A1 is provided with: a first lead 1 including a die-bonding portion 12 with a mount surface 12a, and a front-end sunk portion 14; a second lead 2 including a wire-bonding portion 22 and spaced apart from the first lead 1; an LED chip 3 mounted on the mount surface 12a and provided with a first electrode terminal 31 and a second electrode terminal 32; a wire 61 connecting the second electrode terminal 32 and the wire-bonding portion 22; and a support member 4 including a protective portion 42 and supporting the leads 1 and 2. The protective portion covers the front-end sunk portion 14 with the mount surface 12a exposed, and includes an inclined portion 42a that becomes thinner as proceeding from the die-bonding portion 12 toward the lead 2.

19 Claims, 4 Drawing Sheets

(52) U.S. Cl.
CPC ............... *H01L 2224/32245* (2013.01); *H01L 2224/45144* (2013.01); *H01L 2224/48247* (2013.01); *H01L 2224/48257* (2013.01); *H01L 2224/48465* (2013.01); *H01L 2224/49107* (2013.01); *H01L 2224/73265* (2013.01)

(58) Field of Classification Search
USPC ...... 257/98, 99, E33.057, E33.066, E33.072
See application file for complete search history.

(56) References Cited

U.S. PATENT DOCUMENTS

| | | | |
|---|---|---|---|
| 7,531,845 B2 | 5/2009 | Oshio et al. | |
| 2001/0022390 A1* | 9/2001 | Waitl | H01L 33/486 257/666 |
| 2003/0141510 A1* | 7/2003 | Brunner | H01L 33/486 257/81 |
| 2003/0141563 A1* | 7/2003 | Wang | H01L 33/486 257/432 |
| 2005/0133808 A1* | 6/2005 | Uraya | H01L 33/486 257/99 |
| 2005/0253159 A1* | 11/2005 | Creswick | H01L 23/13 257/98 |
| 2006/0022215 A1* | 2/2006 | Arndt | H01L 33/486 257/99 |
| 2006/0180925 A1* | 8/2006 | Lee | H01L 33/486 257/717 |
| 2007/0040182 A1* | 2/2007 | Lee | H01L 33/642 257/98 |
| 2007/0096136 A1* | 5/2007 | Sun | H01L 33/60 257/99 |
| 2008/0054287 A1* | 3/2008 | Oshio | H01L 33/60 257/99 |
| 2008/0157113 A1* | 7/2008 | Hayashi | H01L 33/486 257/98 |
| 2009/0267102 A1* | 10/2009 | Tsai | H01L 33/56 257/98 |
| 2010/0314654 A1* | 12/2010 | Hayashi | H01L 33/486 257/99 |
| 2011/0121336 A1* | 5/2011 | Bogner | H01L 33/44 257/98 |

FOREIGN PATENT DOCUMENTS

| | | | | |
|---|---|---|---|---|
| JP | 2007-35794 | * | 2/2007 | ............ H01L 33/00 |
| JP | 2008-60344 | | 3/2008 | |
| JP | 2011-35082 | * | 2/2011 | ............ H01L 33/48 |
| KR | 10-2009-0059370 | * | 6/2009 | ............ H01L 33/00 |
| KR | 10-2010-0103587 | * | 9/2010 | ............ H01L 33/48 |
| WO | WO 2008/081794 | * | 7/2008 | ............ H01L 33/00 |
| WO | WO 2008081794 | * | 7/2008 | ............ H01L 33/00 |
| WO | WO 2009/051093 | | 4/2009 | |

OTHER PUBLICATIONS

Machine translation, Park, Korean Pat. Pub. No. KR 10-2009-0059370, translation date: Jul. 7, 2017, K-PION, all pages.*
Machine translation, Bogner, Korean Pat. Pub. No. KR 10-2010-0103587, translation date: Jul. 7, 2017, K-PION, all pages.*
Machine translation, Miki, Japanese Pat. Pub. No. JP 2011-35082, translation date: Jul. 7, 2017, Espacenet, all pages.*

* cited by examiner

LED MODULE

TECHNICAL FIELD

The present invention relates to an LED module incorporating an LED chip.

BACKGROUND ART

FIG. 7 shows an example of conventional LED module (see e.g. Patent Document 1). The LED module X shown in FIG. 7 includes leads 91 and 92, an LSD chip 93, a support member 94 and a light-transmitting member 95. The LED chip 93 is bonded to the lead 91 with a bonding material, not shown. The LED chip 93 has a pair of electrodes on the upper surface in the figure, and the electrodes are connected to the leads 91 and 92 via wires 96 and 97. The support member 94 is made of e.g. a resin and formed by insert molding using a mold to cover part of the leads 91, 92. The light-transmitting member 95 is made of a resin that transmits light from the LED chip 93, and protects the LED chip 93 and the wires 96 and 97. The characteristics of the light to foe emitted from the LED module X, such as color or brightness of the light, are adjusted by adding various substances to the light-transmitting member 95. As shown in FIG. 7, the support member 94 has a reflective surface 94a that reflects light traveling sideways from the LED chip 93 in the figure upward.

In this type of LED module X, the surfaces of the leads 91 and 92 are sometimes plated with silver for enhancing the heat conductivity and electric conductivity. However, when plated with silver, the surfaces sometimes change to a dark color as time elapses. Such color change of the surfaces of the leads 91, 92 results in change in characteristics of the light emitted from the LED module X, which shortens the time period daring which the LED module X can be used properly.

To avoid the above-described adverse effects of the color change, protective portions 94b may be provided to cover the leads 91 and 92, as shown by phantom lines in FIG. 7. In such a case, however, in the process of setting the wires 96 and 97, the wires 96 and 97 are sometimes broken due to the contact with the protective portions 94b.

TECHNICAL REFERENCE

Patent Document

Patent Document 1: JP-A-2004-127988

SUMMARY OF THE INVENTION

Problems to be Solved by the Invention

The present invention has been conceived under the circumstances described above. It is therefore an object of the present invention to provide an LED module that can achieve a long lifetime without reducing the reliability and light emission amount.

Means for Solving the Problems

According to a first aspect of the present invention, there is provided an LED module comprising: a first lead including a die-bonding portion and a front-end sunk portion, the die-bonding portion being formed with a mount surface disposed on one side in a thickness direction, the front-end sunk portion being connected to the die-bonding portion; a second lead including a wire-bonding portion and spaced apart from the first lead, the second lead being arranged such that a thickness direction of the wire-bonding portion corresponds to a thickness direction of the die-bonding portion of the first lead; an LED chip mounted on the mount surface and provided with a first electrode terminal and a second electrode terminal, the first electrode terminal being electrically connected to the first lead, the second electrode terminal being disposed on the one side in the thickness direction and electrically connected to the second lead; a wire connecting the second electrode terminal and the wire-bonding portion to each other; and a support member including a protective portion and supporting the first and the second leads, the protective portion covering the front-end sunk portion with the mount surface exposed, the protective portion including an inclined portion that becomes thinner as proceeding away from the die-bonding portion toward the second lead.

According to a second aspect of the present invention, in the LED module of the first aspect, the inclined portion overlaps the second lead as viewed in the thickness direction.

According to a third aspect of the present invention, in the LED module or the first or second aspect, the bonding portion is metal-plated on the one side in the thickness direction.

According to a fourth aspect of the present invention, in the LED module of any one of the first through the third aspects, the first electrode terminal is bonded to the die-bonding portion.

According to a fifth aspect of the present invention, in the LED module of any one of the first through the third aspects, the first electrode terminal is provided on a portion of the LED chip disposed the one side in the thickness direction, and the first lead includes a wire-bonding portion disposed on an opposite side of the front-end sunk portion across the die-bonding portion and exposed from the protective portion. The LED module further comprises an additional wire connected to the first electrode terminal and the wire-bonding portion of the first lead.

According to a sixth aspect of the present invention, in the LED module of the fifth aspect, the protective portion includes an additional inclined portion that becomes thinner as proceeding away from the die-bonding portion toward the wire-bonding portion of the first lead in a direction in which the additional wire extends.

According to a seventh aspect of the present invention, in the LED module of the fifth or sixth aspect, the wire-bonding portion is metal-plated on the one side in the thickness direction.

According to an eighth aspect of the present invention, in the LED module of any one of the first through the seventh aspects, the support member is made of a resin that reflects light emitted from the LED chip, and the support member includes a reflective surface inclined to become further away from the LED chip in the thickness direction as proceeding away from the LED chip in a direction perpendicular to the thickness direction.

According to a ninth aspect of the present invention, in the LED module of the eighth aspect, the reflective surface is in the form of a frame surrounding the LED chip as viewed in the thickness direction, and the protective portion is connected to the reflective surface.

According to a tenth aspect of the present invention, in the LED module of the ninth aspect, the reflective surface includes an inner edge that, is in the form of an elongated rectangle as viewed in the thickness direction, and the LED chip is arranged at a center in a short-side direction of the inner edge.

According to an eleventh aspect of the present invention, in the LED module of the tenth aspect, the LED chip is arranged at a center in a longitudinal direction of the inner edge.

According to a twelfth aspect of the present invention, in the LED module of the first through the eleventh aspects, the die-bonding portion bulges toward the one side in the thickness direction relative to the front-end sunk portion.

According to this arrangement, since the first lead and the second lead are covered by the protective portion, effects of color change of the first and the second leads on the characteristics of the light to be emitted are suppressed. Thus, the light emitting element module according to the present invention provides a longer lifetime without reducing reliability.

Other features and advantages of the present invention become clearer from detailed description given below with reference to the accompanying drawings.

MODE FOR CARRYING OUT THE INVENTION

Preferred embodiments of the present invention are described below with reference to the accompanying drawings.

Figure 1:
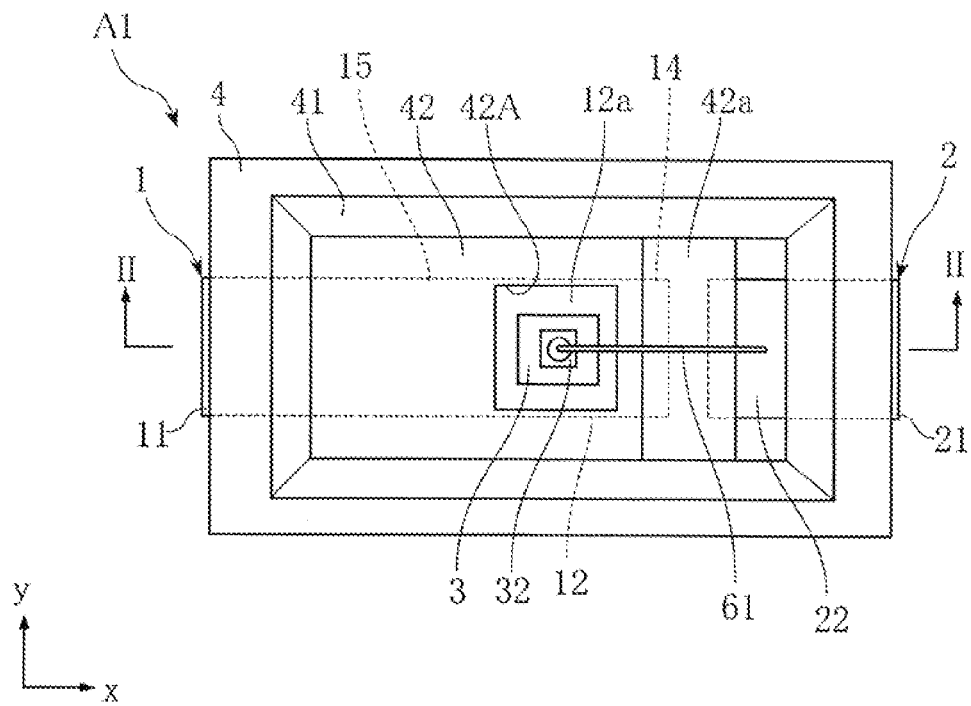
FIG. 1 is a plan view showing an LED module according to a first embodiment of the present invention.
Figure 2:
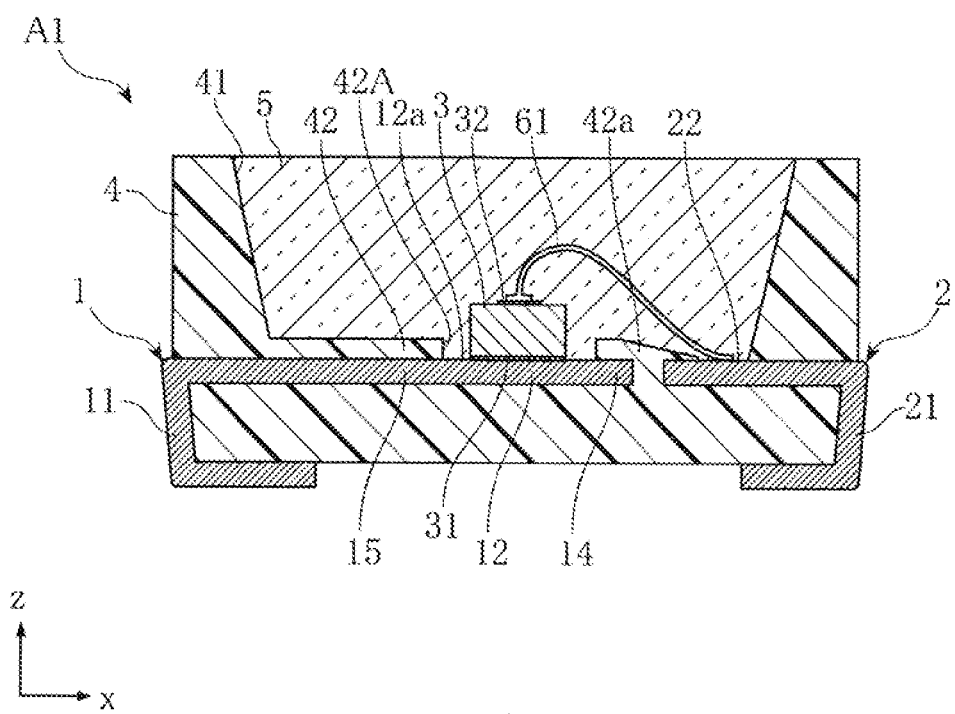
FIG. 2 is a sectional view taken along lines II-II in FIG. 1.

FIGS. 1 and 2 show an LED module according to a first embodiment of the present invention. The LED module A1 of this embodiment includes leads 1 and 2 electrically insulated from each other, an LED chip 3, a support member 4 supporting the leads 1 and 2, a light-transmitting member 5 covering the LED chip 3, and a wire 61. The LED module A1 is designed such that the LED chip 3 emits light due to connection of the leads 1 and 2 to an external electric circuit. In FIG. 1, illustration of the light-transmitting member 5 is omitted. The LED module A1 is in the form of an elongated rectangle with a longer side extending in the x direction and a shorter side extending in the y direction, as viewed in the z direction.

As shown in FIGS. 1 and 2, the lead 1 includes a terminal portion 11, a die-bonding portion 12, a root sunk portion 15, and a front-end sunk portion 14. The lead 1 is formed by e.g. plating a copper plate which is 0.15 to 0.20 mm in thickness with silver. The terminal portion 11 is exposed to the outside on the left side of the support member 4 in the x direction and used to connect the lead 1 to an external electric circuit. The terminal portion 11 is formed by bending a portion of the lead 1 which projects from the support member 4.

The die-bonding portion 12 is provided between the front-end sunk portion 14 and the root sunk portion 15. The upper surface of the die-bonding portion 12 in the direction z is a mount surface 12a on which the LED chip 3 is mounted. The front-end sunk portion 14 is connected to the die-bonding portion 12 and positioned on the front end side. The root sunk portion 15 is connected to the die-bonding portion 12 and positioned on the root side.

As shown in FIGS. 1 and 2, the lead 2 is spaced apart from the lead 1 in the x direction and includes a terminal portion 21 and a wire-bonding portion 22. The lead 2 is formed by e.g. plating a copper plate which is 0.15 to 0.20 mm in thickness with silver. The terminal portion 21 is exposed to the outside on the right side of the support member 4 in the x direction and used to connect the lead 2 to an external electric circuit. The terminal portion 21 is formed by bending a port ion of the lead 2 which projects from the support member 4. The wire-bonding portion 22 is provided at the left end of the lead 2 in the x direction and used to bond the wire 61.

The LED chip 3 is formed by laminating semiconductor materials such as gallium nitride. The LED chip 3 emits blue light, green light, red light or the like due to recombination of electrons and holes in an active layer sandwiched between an n-type semiconductor layer and a p-type semiconductor layer. The LED chip 3 is provided with an electrode terminal 31 electrically connected to the n-type semiconductor layer and an electrode terminal 32 electrically connected to the p-type semiconductor layer. As shown in FIG. 2, the electrode terminal 31 is provided on the lower end surface of the LED chip 3 in the z direction, whereas the electrode terminal 32 is provided on the upper end surface. For instance, the LED chip 3 is generally in the form of a rectangular parallelepiped having dimensions of e.g. 0.3 mm in the x direction, 0.3 mm in the y direction, and 0.15 mm in the z direction. The LED chip 3 having this structure emits light in almost all directions except downward in the z direction.

The LED chip 3 is bonded to the mount surface 12a by using a conductive bonding material, not shown, so that the electrode terminal 31 is electrically connected to the die-bonding portion 12. The electrode terminal 32 is connected to the wire-bonding portion 22 via a wire 61. Specifically, the wire 61 is e.g. a gold wire and extends in the x direction. The left end of the wire in the x direction is bonded to the electrode terminal 32, whereas the right end in the x direction is bonded to the wire-bonding portion 22.

Figure 3:
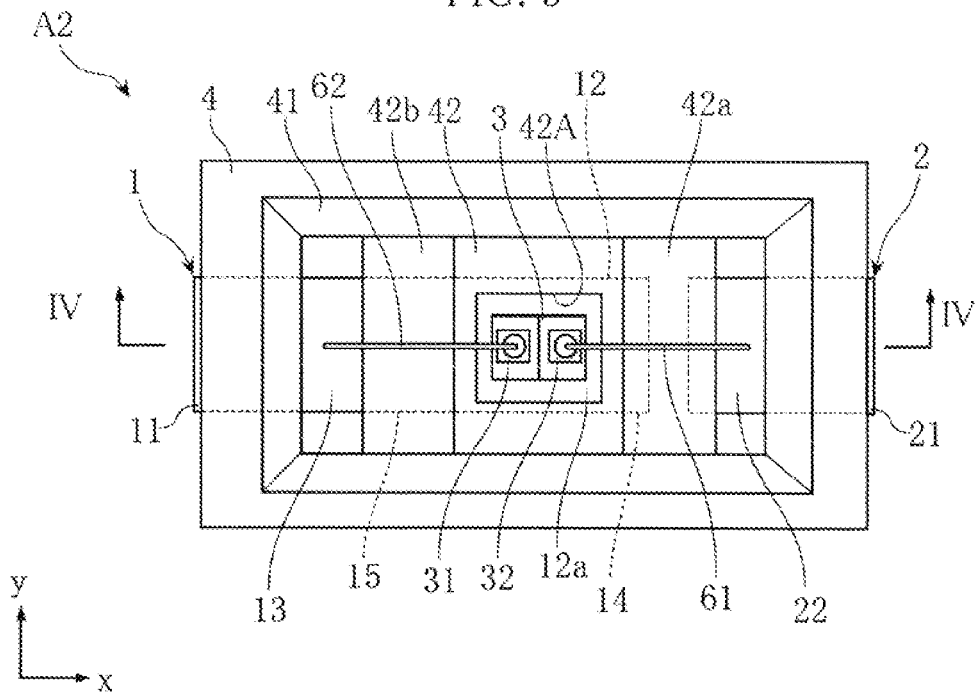
FIG. 3 is a plan view showing an LED module according to a second embodiment of the present invention.

The support member 4 is made of a white epoxy resin in which titanium oxide is mixed and has a rectangular shape in plan view as shown in FIG. 1. The support member 4 fixes the leads 1 and 2 by covering part of each lead. The support member 4 is recessed at the center and has a reflective surface 41. As shown in FIGS. 2 and 3, the reflective surface 41 is inclined to become further away from the LED chip 3 in the x direction or the y direction as proceeding upward in the z direction. The reflective surface 41 is in the form of a frame surrounding the LED chip 3, as viewed in the z direction. The inner edge of the reflective surface 41 is in the form of an elongated rectangle having a length in the x direction, as viewed in the z direction. The die-bonding portion 12 is arranged at the center in the x direction and the y direction with respect to the inner edge of the reflective surface 41. The reflective surface 41 serves to reflect the light, which is emitted from the LED chip 3 in a direction perpendicular to the z direction, upward in the z direction.

The support member 4 includes a protective portion 42. The protective portion 42 extends from the inner edge of reflective surface 41 and covers the root sunk portion 15 and front-end sunk portion 14 of the lead 1, and part of the lead 2. The protective portion 42 is about 0.05 mm in thickness. The protective portion 42 has an opening 42A that exposes the mount surface 12a of the die-bonding portion 12. For instance, the opening 42A is rectangular as viewed in the direction z and have dimensions of about 0.4 mm in the x direction and about 0.4 mm in the y direction. As shown in FIG. 2, the upper surface of the protective portion 42 in the z direction is below the upper end of the LED chip 3 in the z direction. The protective portion 42 has, on the right side of the opening 42A in the x direction, an inclined portion 42a that becomes thinner in the z direction as proceeding to the right in the x direction. The inclined portion 42a extends over the entire width of the inner edge of the frame defined by the reflective surface 41 in the y direction and over a length of e.g. about 1.0 mm in the x direction. The right end of the inclined portion 42a in the x direction covers the left end of the lead 2 in the x direction. The protective portion 42 ends at the right end of the inclined portion 42a in the x direction and exposes the upper surface of the wire-bonding portion 22 to which the right end of the wire 61 in the x direction is bonded.

The support member 4 having the above-described structure is made by insert molding using a mold. Specifically, the support member 4 is formed by setting the leads 1 and 2 in a mold, pouring liquid epoxy resin into the mold and then hardening the resin.

The light-transmitting member 5 is formed to fill the region surrounded by the reflective surface 41 and covers the die-bonding portion 12, the bonding portion 22, the LED chip 3 and the wire 61 for protection. For instance, the light-transmitting member 5 is made of transparent epoxy resin.

The advantages of the LED module A1 are described below.

According to this embodiment, the leads 1 and 2 are covered by the white protective portion 42 except the region for mounting the LED chip 3. Thus, even when the silver-plated surfaces of the leads 1 and 2 change to a dark color, the dark portion is not excessively exposed. Thus, the color of the light emitted at the start of the use is maintained for a long time. Moreover, owing to the provision of the inclined portion 42a, the thickness of the protective portion 42 is small adjacent to the wire-bonding portion 22. This arrangement reduces the possibility that the wire 61 comes into contact with the protective portion 42. In the LED module A1, therefore, breakage of the wire 61 due to contact with the protective portion 42 is unlikely to occur.

Since the upper end of the LED chip 3 in the z direction is above the upper surface of the protective portion 42 in the z direction, light traveling sideways from the upper end of the LED chip 3 is properly reflected upward in the z direction by the reflective surface 41 without being blocked by the protective portion 42. Thus, the LED module A1 can increase light emission amount.

Other embodiments of the present invention are described below. In these figures, the elements that are identical or similar to those of the foregoing embodiment are designated by the same reference signs as those used for the foregoing embodiment, and the description are omitted appropriately.

Figure 4:
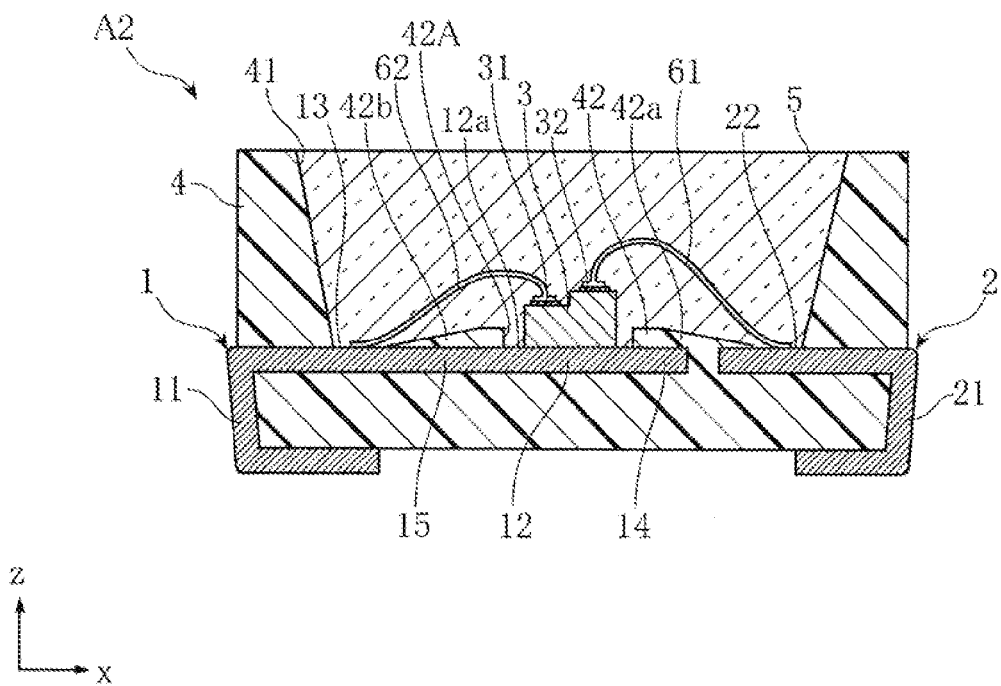
FIG. 4 is a sectional view taken along lines IV-IV in FIG. 3.

FIGS. 3 and 4 show an LED module A2 according to a second embodiment of the present invention. In the LED module A2, the LED chip 3 is provided with two electrode terminals 31 and 32 on the upper end surface in the z direction, and accordingly, the lead 1 is provided with a wire-bonding portion 13. Further, the protective portion 42 has an inclined portion 42b so that the wire-bonding portion 13 is exposed. The structures of other parts of the LED module A2 are the same as those of the LED module A1.

The basic structure of the LED chip 3 is the same as that of the LED module A1. The electrode terminal 31 electrically connected to the n-type semiconductor layer is provided on the left side in the x direction on the upper end surface in the z direction, whereas the electrode terminal 32 electrically connected to the p-type semiconductor layer is provided on the right side in the x direction on the upper end surface in the z direction. The electrode terminal 31 is connected to the wire-bonding portion 13 by a wire 62.

The inclined portion 42b is provided between the die-bonding portion 12 and the wire-bonding portion 13 in the x direction and formed to become thinner as proceeding to the left in the x direction. The inclined portion 42b is about 1.0 mm in length in the x direction. The provision of the inclined portion 42b prevents contact between the protective portion 42 and the wire 62.

With the LED module A2 again, the leads 1 and 2 are covered by the protective portion 42 except the region for mounting the LED chip 3. Thus, effects of color change of the silver-plated surfaces of the leads 1, 2 are reduced. Thus, the color of the light emitted at the start of the use is maintained for a long time, whereby a longer lifetime is provided. Since the protective portion 42 includes inclined portions 42a and 42b, breakage of the wires 61 and 62 is prevented. Thus, the reliability is not reduced.

In the LED module A2 having the above-described structure, a non-conductive resin can be used as a bonding material for bonding the LED chip 3 to the mount surface 12a.

Figure 5:
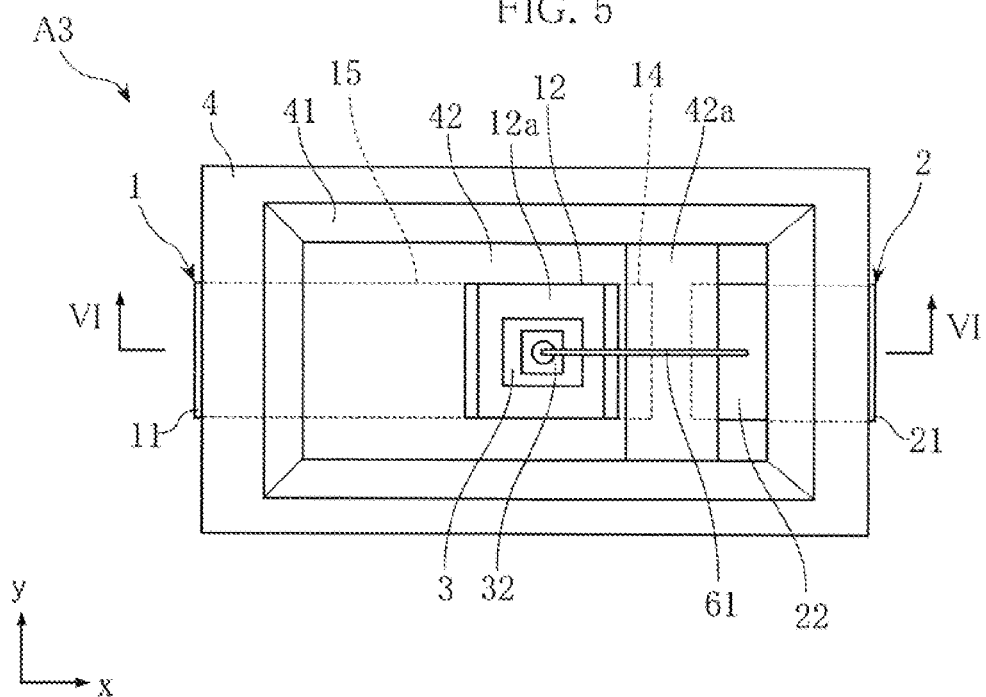
FIG. 5 is a plan view showing an LED module according to a third embodiment of the present invention.
Figure 6:
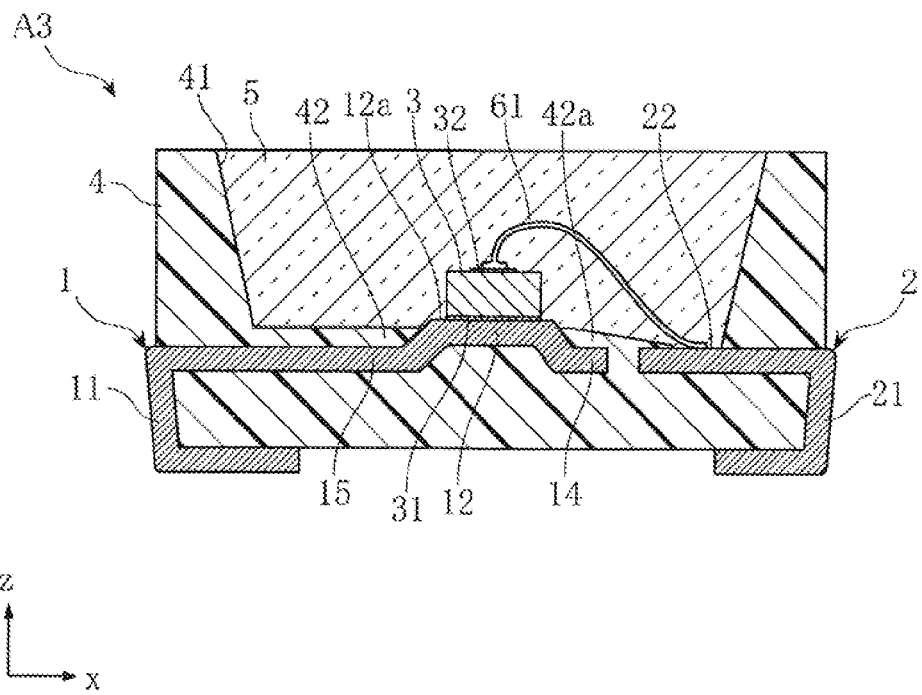
FIG. 6 is a sectional view taken along lines VI-VI in FIG. 5.
Figure 7:
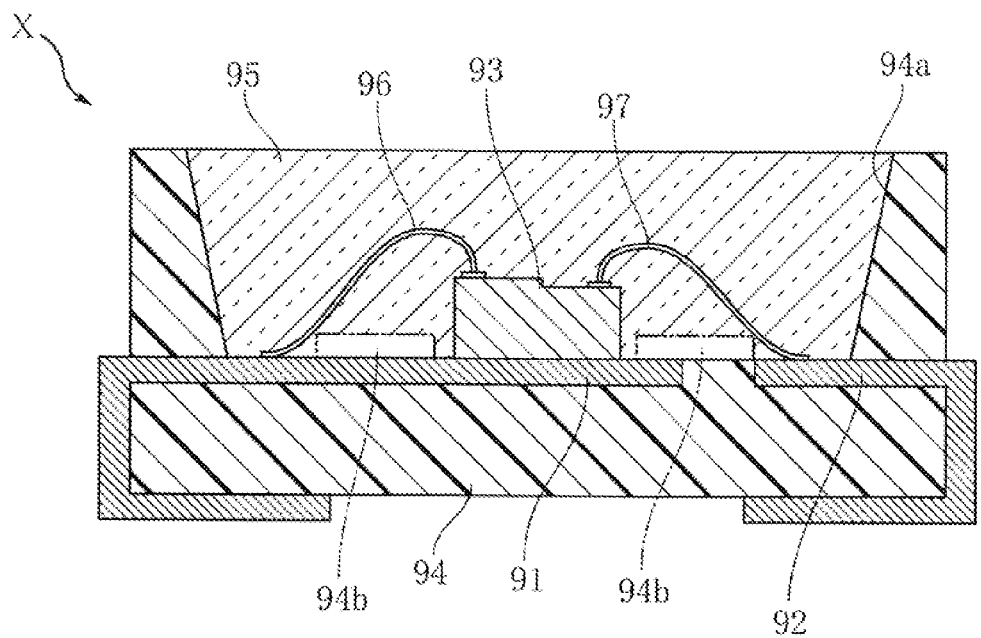
FIG. 7 is a sectional view showing an example of conventional LED module.

FIGS. 5 and 6 show an LED module A3 according to a third embodiment of the present invention. The LED module A3 differs from the LED module A1 in shape of the die-bonding portion 12. Other structures of this LED module are the same as those of LED module A1.

In this embodiment, a portion adjacent to the right end of the lead 1 in the x direction is bent upward in the direction z, so that the mount surface 12a of the die-bonding portion 12 projects above the protective portion 42. The die-bonding portion 12 is above the front-end sunk portion 14 and the root sunk portion 15 in the z direction. The height difference between the die-bonding portion 12 and the front-end sunk portion 14 or the root sunk portion 15 is e.g. about 0.1 mm.

With this arrangement, the entire LED chip 3 is above the protective portion 42 in the z direction. This further reduces the possibility that the wire 61 comes into contact with the protective portion 42 in the process of setting the wire 61. Thus, the reliability is farther enhanced.

Moreover, in the LED module A3, light traveling sideways from the LED chip 3 in a direction perpendicular to the z direction is not blocked by the protective portion 42. Thus, the LED module A3 provides further increase of the light emission amount.

The LED module according to the present invention is not limited to the foregoing embodiments. The specific structure of each part of the LED module according to the present invention can be varied in design in many ways. For instance, although the inclined portions 42a and 42b are provided over the entire width of the protective portion 42 in the y direction in the foregoing embodiments, the inclined portions 42a and 42b may be provided only at the regions where they need to be provided for avoiding the wires 61 and 62.

In the foregoing embodiments, the LED chip 3 is bonded to the die-bonding portion 12 provided in the lead 1 in the form of an elongated plate extending in the x direction.

However, the shape of the lead 1 can be selected appropriately. Moreover, the outer configuration of the support member 4 can be selected appropriately, and accordingly, the shape of the reflective surface 41 as viewed in the z direction can be changed. For instance, the reflective surface 41 may be annular as viewed in the z direction. In this case, it is desirable to arrange the die-bonding portion 12 at the center of the circle defined by the reflective surface 41.

Moreover, although the reflective surface 41 is a flat surface in the foregoing embodiments, it may be a curved surface. When the reflective surface 41 is a curved surface, it is desirable that reflective surface 41 forms part of a concave mirror with the LED chip 3 positioned at the focal point.

Although the support member 4 is made of white resin in the foregoing embodiments, resin other than white resin can be used as long as it reflects light emitted from the LED chip 3.

Although the electrode terminal 31 electrically connected to the n-type semiconductor layer is connected to the lead 1, whereas the electrode terminal 32 electrically connected to the p-type semiconductor layer is connected to the lead 2 in the LED modules A1 and A2, these connections may be reversed.

The surfaces of the leads 1 and 2 are plated with silver in the foregoing embodiments. The silver-plating may foe applied to both the upper and lower surfaces in the z direction. Alternatively, the silver-plating may foe applied only to the upper surfaces of the leads 1 and 2 in the z direction.

The invention claimed is:

1. An LED module, comprising:
    a first lead including a die-bonding portion and a front-end portion, the die-bonding portion being formed with a mount surface and a reverse surface spaced apart from each other in a thickness direction, the front-end portion being connected to the die-bonding portion and including a first end face at an end thereof;
    a second lead including a wire-bonding portion and spaced apart from the first lead in an offset direction perpendicular to the thickness direction, the second lead including a second end face at an end thereof, the second end face facing the first end face in the offset direction;
    an LED chip mounted on the mount surface and provided with a first electrode terminal and a second electrode terminal, the first electrode terminal being electrically connected to the first lead, the second electrode terminal being electrically connected to the second lead;
    a wire connecting the second electrode terminal and an upper surface of the wire-bonding portion to each other; and
    a support member including a protective portion and supporting the first and the second leads, the protective portion covering the front-end portion and a part of the second lead, the protective portion including an inclined portion that becomes thinner in the thickness direction with increasing distance from the first lead toward the second lead,
    wherein
    the inclined portion comprises an upper inclined surface part, a height of the inclined portion in the thickness direction constantly decreasing with increasing distance from the front-end portion towards the wire-bonding portion, over an area from the first end face to the second end face as viewed in the thickness direction.

2. The LED module according to claim 1, wherein the inclined portion overlaps the second lead as viewed in the thickness direction.

3. The LED module according to claim 1, wherein the die-bonding portion is at least partially metal-plated.

4. The LED module according to claim 1, wherein the first electrode terminal is bonded to the die-bonding portion.

5. The LED module according to claim 1, further comprising an additional wire,
    wherein the first lead includes a wire-bonding portion disposed opposite to the front-end portion across the die-bonding portion and exposed from the protective portion, and
    the first electrode terminal and the wire-bonding portion of the first lead are connected to each other by the additional wire.

6. The LED module according to claim 5, wherein the protective portion includes an additional inclined portion that becomes thinner in the thickness direction with increasing distance from the die-bonding portion toward the wire-bonding portion of the first lead in a direction in which the additional wire extends.

7. The LED module according to claim 5, wherein the wire-bonding portion of the first lead is at least partially metal-plated.

8. The LED module according to claim 1, wherein the support member is made of a resin that reflects light emitted from the LED chip, and the support member includes a reflective surface inclined to become farther away from the LED chip in the thickness direction with increasing distance from the LED chip in a direction perpendicular to the thickness direction.

9. The LED module according to claim 8, wherein the reflective surface is in a form of a frame surrounding the LED chip as viewed in the thickness direction, and
    the protective portion is connected to the reflective surface.

10. The LED module according to claim 9, wherein the reflective surface includes an inner edge in a form of an elongated rectangle as viewed in the thickness direction, and
    the LED chip is arranged at a center in a short-side direction of the inner edge.

11. The LED module according to claim 10, wherein the LED chip is arranged at a center in a longitudinal direction of the inner edge.

12. The LED module according to claim 1, wherein the die-bonding portion bulges in the thickness direction relative to the front-end portion.

13. The LED module according to claim 1, wherein a side surface of the LED chip overlaps the inclined portion as viewed in the offset direction, and
    the upper inclined surface part has a highest point located closer to the side surface of the LED chip than to the second lead.

14. The LED module according to claim 13, wherein the highest point is located above the first lead, and located higher than both of a level of the mount surface of the die-bonding portion and a level of the upper surface of the wire-bonding portion,
    the upper inclined surface part decreases in height from the highest point, and
    the inclined portion exposes the wire-bonding portion of the second lead.

15. An LED module comprising:
a first lead including a die-bonding portion and a front-end portion, the front-end portion being connected to the die-bonding portion and including a first end face at an end thereof;
a second lead spaced apart from the first lead and including a wire-bonding portion on a surface thereof and a second end face at an end thereof, the second end face facing the first end face each other in an offset direction perpendicular to a thickness direction of the LED module;
a support member supporting the first lead and the second lead;
an LED chip provided with an electrode and mounted on the die-bonding portion of the first lead, the die-bonding portion being exposed from the support member; and
a wire connecting the electrode of the LED chip to the wire-bonding portion, the wire-bonding portion being exposed from the support member,
wherein the support member comprises an inclined portion and a first insulating portion,
the first insulating portion and part of the inclined portion are disposed above the first lead, and
the inclined portion comprises an upper inclined surface part, a height of the inclined portion in the thickness direction constantly decreasing with increasing distance from the front-end portion towards the wire-bonding portion, over an area from the first lead to the second lead as viewed in a direction normal to the surface of the first lead.

16. The LED module according to claim 15, wherein the inclined portion bridges between the first lead and the second lead.

17. The LED module according to claim 15, further comprising a second insulating portion that covers at least a part of the first lead.

18. The LED module according to claim 17, wherein the second insulating portion becomes greater in size measured in the direction normal to the surface of the first lead with increasing distance from the LED chip.

19. The LED module according to claim 15, wherein the first insulating portion is formed integral with the inclined portion and has an end face that faces the side surface of the LED chip.

* * * * *